(12) United States Patent
Korpi et al.

(10) Patent No.: US 8,575,591 B2
(45) Date of Patent: Nov. 5, 2013

(54) APPARATUS FOR FORMING A NANOSCALE SEMICONDUCTOR STRUCTURE ON A SUBSTRATE BY APPLYING A CARRIER FLUID

(75) Inventors: Petri Juhani Korpi, Kangasala (FI); Risto Johannes Johannes Rönkkä, Tampere (FI)

(73) Assignee: Nokia Corporation, Espoo (FI)

( * ) Notice: Subject to any disclaimer, the term of this patent is extended or adjusted under 35 U.S.C. 154(b) by 285 days.

(21) Appl. No.: 12/598,368

(22) PCT Filed: Mar. 31, 2008

(86) PCT No.: PCT/EP2008/053781
§ 371 (c)(1),
(2), (4) Date: Jul. 26, 2010

(87) PCT Pub. No.: WO2008/132000
PCT Pub. Date: Nov. 6, 2008

(65) Prior Publication Data
US 2010/0283032 A1 Nov. 11, 2010

(30) Foreign Application Priority Data
Apr. 30, 2007 (GB) .................................. 0708381.9

(51) Int. Cl.
*H01L 29/06* (2006.01)
(52) U.S. Cl.
USPC ................ 257/9; 257/E29.071; 257/E29.168; 977/778; 977/787

(58) Field of Classification Search
USPC ........ 257/9, E29.071, E29.168; 977/778, 787
See application file for complete search history.

(56) References Cited

U.S. PATENT DOCUMENTS

| | | | |
|---|---|---|---|
| 6,673,401 B2* | 1/2004 | Black et al. | 428/34.1 |
| 6,802,489 B2* | 10/2004 | Marr et al. | 251/129.14 |
| 6,879,143 B2* | 4/2005 | Nagahara et al. | 324/71.1 |
| 6,888,665 B2* | 5/2005 | Feldheim et al. | 359/328 |
| 6,962,823 B2* | 11/2005 | Empedocles et al. | 438/3 |
| 7,057,206 B2* | 6/2006 | Halik et al. | 257/40 |
| 7,067,341 B2 | 6/2006 | Mascolo | |
| 7,098,163 B2* | 8/2006 | Hampden-Smith et al. | 502/101 |
| 7,285,795 B2* | 10/2007 | Redecker et al. | 257/40 |

(Continued)

FOREIGN PATENT DOCUMENTS

| | | |
|---|---|---|
| WO | 97/38810 | 10/1997 |
| WO | 01/01475 | 1/2001 |

(Continued)

OTHER PUBLICATIONS

International Search Report and Written Opinion Published in Relation to PCT Application No. PCT/EP2008/053781 sent on Oct. 16, 2008, p. 1-15.

(Continued)

*Primary Examiner* — Ida M Soward
(74) *Attorney, Agent, or Firm* — Harrington & Smith

(57) ABSTRACT

An apparatus applies a carrier fluid to a semiconductor substrate. The carrier fluid carries nanoparticles. The positions of a plurality of particles in the carrier fluid are manipulated by applying an electric field, removing the carrier fluid from the substrate so as to leave the nanoparticles on the substrate, and sintering the nanoparticles to form a region.

8 Claims, 16 Drawing Sheets

(56) References Cited

U.S. PATENT DOCUMENTS

| | | | |
|---|---|---|---|
| 7,494,907 B2 * | 2/2009 | Brown et al. | 438/584 |
| 7,615,483 B2 * | 11/2009 | Daniel et al. | 438/637 |
| 7,737,006 B2 * | 6/2010 | Colfer et al. | 438/478 |
| 7,785,496 B1 * | 8/2010 | Shim et al. | 252/500 |
| 7,901,939 B2 * | 3/2011 | Ismagliov et al. | 436/4 |
| 7,955,645 B2 * | 6/2011 | Mayer et al. | 427/229 |
| 8,231,369 B2 * | 7/2012 | Rajala et al. | 425/7 |
| 2003/0048619 A1 | 3/2003 | Kaler | |
| 2006/0003097 A1 * | 1/2006 | Andres et al. | 427/212 |
| 2006/0051257 A1 * | 3/2006 | Lee et al. | 422/129 |
| 2006/0071205 A1 * | 4/2006 | Nauka | 257/20 |
| 2006/0175192 A1 * | 8/2006 | Lin | 204/194 |
| 2008/0008822 A1 * | 1/2008 | Kowalski et al. | 427/58 |
| 2008/0237611 A1 * | 10/2008 | Cok et al. | 257/79 |
| 2008/0248306 A1 * | 10/2008 | Spillmann et al. | 428/403 |
| 2009/0053400 A1 * | 2/2009 | la Vega et al. | 427/98.4 |
| 2009/0053469 A1 * | 2/2009 | Sato et al. | 428/148 |
| 2010/0089453 A1 * | 4/2010 | Robinson et al. | 136/264 |
| 2010/0246009 A1 * | 9/2010 | Polley et al. | 359/578 |
| 2011/0092010 A1 * | 4/2011 | Van Duren et al. | 438/62 |
| 2011/0105367 A1 * | 5/2011 | Bicerano et al. | 507/112 |
| 2011/0130616 A1 * | 6/2011 | Seeney et al. | 600/14 |
| 2011/0155571 A1 * | 6/2011 | Carpenter et al. | 204/400 |

FOREIGN PATENT DOCUMENTS

| | | |
|---|---|---|
| WO | 2004052489 | 6/2004 |
| WO | 2005/014889 | 2/2005 |
| WO | 2006075968 | 7/2006 |

OTHER PUBLICATIONS

Combined Search and Examination Report for Great Britain Application No. GB0708381.9 sent on Sep. 13, 2007, p. 1-7.

* cited by examiner

○ N-doped nanoparticles 201
○ P-doped nanoparticles 202

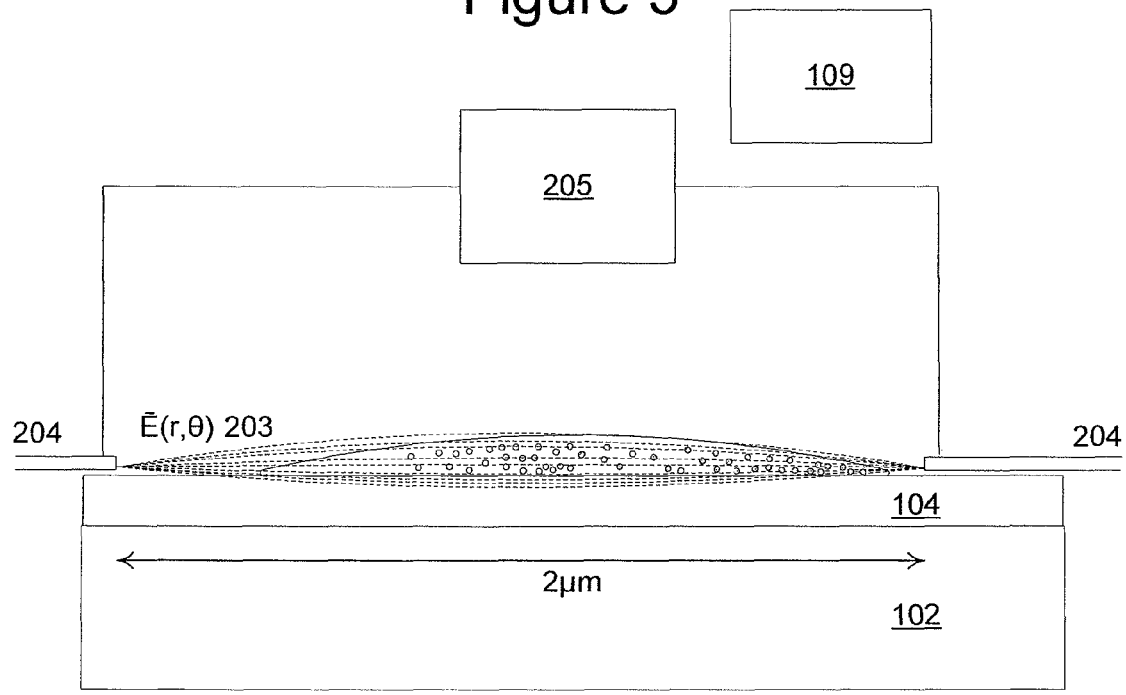
- N-doped nanoparticles 201
- P-doped nanoparticles 202

- N-doped nanoparticles 201
- P-doped nanoparticles 202

- N-doped nanoparticles 201
- P-doped nanoparticles 202

- N-doped nanoparticles 201
- P-doped nanoparticles 202

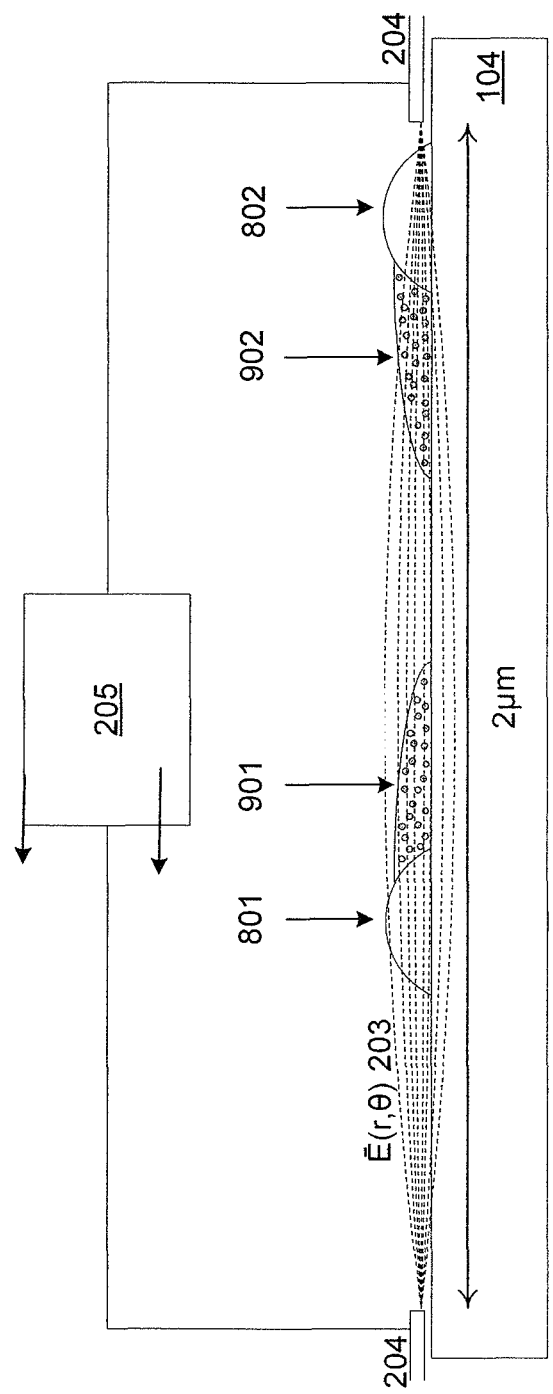

- N-doped nanoparticles 201
- P-doped nanoparticles 202

APPARATUS FOR FORMING A NANOSCALE SEMICONDUCTOR STRUCTURE ON A SUBSTRATE BY APPLYING A CARRIER FLUID

RELATED APPLICATION

This application was originally filed as PCT Application No. PCT/EP 2008/053781 on Mar. 31, 2008 and claims priority to Great Britain Application No. 0708381.9 filed on Apr. 30, 2007, which is incorporated herein by reference in its entirety.

FIELD OF THE INVENTION

The present invention relates to a method for forming a semiconductor structure on a substrate, particularly, but not exclusively, to a method for forming a nanoscale semiconductor structure on a substrate using a carrier fluid application process.

BACKGROUND

The fabrication of semiconductor devices using printing techniques provides a potentially inexpensive means of producing complex semiconductor circuits. This type of semiconductor fabrication promises to extend the use of semiconductor circuits to many new applications, as well as providing an alternative to conventional silicon-based fabrication processes.

Semiconductors fabricated by printing techniques have an advantage over conventional silicon based semiconductors in that, in addition to lower manufacturing costs, they do not possess the inherent rigidity of silicon-based semiconductors. Thus, printed semiconductors may be formed on a wider variety of substrates including, for example, clothing, food labels and toys.

However, printed semiconductor devices have so far only been reduced to a micrometre scale and are, therefore, considerably larger than the nanometre scale of their silicon counterparts. This limit on the scale of printed semiconductor devices acutely reduces the number of applications for which they may potentially be used, for example printed semiconductor devices of a micrometre scale are unsuitable for use in microprocessors and signal processing circuits.

SUMMARY OF THE INVENTION

According to the invention, there is provided a method comprising applying a carrier fluid to a substrate, the carrier fluid carrying nanoparticles, manipulating the positions of a plurality of the nanoparticles in the carrier fluid by applying an electric field, removing the carrier fluid from the substrate so as to leave the nanoparticles on the substrate and sintering the nanoparticles to form a region.

Applying the carrier fluid may comprise printing the carrier fluid onto the substrate.

Printing the carrier fluid may comprise printing the carrier fluid using an inkjet printing process.

The electric field may comprise a non-uniform electric field.

Removing the carrier fluid may comprise vaporizing the carrier fluid by exposing the carrier fluid to a heat source.

Removing the carrier fluid may comprise vaporizing the carrier fluid by exposing the carrier fluid to an infra-red radiation source.

Removing the carrier fluid may comprise vaporizing the carrier fluid by exposing the carrier fluid to a microwave radiation source.

Removing the carrier fluid may comprise vaporizing the carrier fluid by exposing the carrier fluid to an electric field source.

Sintering the nanoparticles may comprise exposing the nanoparticles to a heat source.

Sintering the nanoparticles may comprise exposing the nanoparticles to an infra-red radiation source.

Sintering the nanoparticles may comprise exposing the nanoparticles to an ultra-violet radiation source.

Sintering the nanoparticles may comprise exposing the nanoparticles to a microwave radiation source.

Sintering the nanoparticles may comprise exposing the nanoparticles to an electric field source.

Applying the carrier fluid to the substrate may be preceded by applying a protective coating to a plurality of the nanoparticles, the protective coating affecting the dielectric properties of the nanoparticles.

Applying the protective coating may comprise applying a latex coating.

Removing the carrier fluid may further comprise removing the protective coating from the nanoparticles.

Removing the protective coating may comprise vaporizing the protective coating by exposing the coated nanoparticles to an energy source.

Manipulating the positions of the nanoparticles may comprise creating a dielectrophoretic effect on the nanoparticles.

The method may further comprise controlling the temperature of the substrate during the step of applying the carrier fluid to the substrate, such that the carrier fluid becomes substantially frozen.

The nanoparticles may comprise semiconductor nanoparticles.

The nanoparticles may comprise n-doped nanoparticles, and sintering the n-doped nanoparticles may comprise forming a semiconducting n-region.

The nanoparticles may comprise p-doped nanoparticles, and sintering the p-doped nanoparticles may comprise forming a semiconducting p-region.

The nanoparticles may comprise n-doped nanoparticles and p-doped nanoparticles, and sintering the nanoparticles may comprise forming a semiconducting n-region and a semiconducting p-region.

The method may include sintering the n-doped nanoparticles during a separate time interval to the p-doped nanoparticles, and sintering the n-doped nanoparticles at a different temperature to the p-doped nanoparticles.

The method may further comprise applying a further carrier fluid to the substrate, the further carrier fluid carrying a plurality of further semiconductor nanoparticles, removing the further carrier fluid from the substrate so as to leave the further semiconductor nanoparticles on the substrate and sintering the further semiconductor nanoparticles to form a semiconducting region.

Applying the further carrier fluid to the substrate may be preceded by applying a protective coating to a plurality of the further semiconductor nanoparticles, the protective coating affecting the dielectric properties of the further semiconductor nanoparticles.

Applying the protective coating to the further semiconductor nanoparticles may comprise applying a latex coating.

Removing the further carrier fluid may further comprise removing the protective coating from the further semiconductor nanoparticles.

Removing the protective coating from the further semiconductor nanoparticles may comprise vaporizing the protective coating by exposing the further semiconductor nanoparticles to a heat source.

The further semiconductor nanoparticles may comprise n-doped nanoparticles, and sintering the further semiconductor nanoparticles may comprise forming a semiconducting n-region.

The further semiconductor nanoparticles may comprise p-doped nanoparticles, and sintering the further semiconductor nanoparticles may comprise forming a semiconducting p-region.

The method may further comprise forming a dielectric region on a surface of the sintered nanoparticles and forming a metal contact on a surface of the dielectric region.

According to the invention, there is provided apparatus comprising a carrier fluid delivery mechanism, an electric field source and an energy source, wherein the carrier fluid delivery mechanism is operable to apply a carrier fluid carrying nanoparticles to a substrate, the electric field source is operable to manipulate the positions of the nanoparticles on the substrate by dielectrophoresis, and the energy source is operable to remove the carrier fluid from the substrate so as to leave the nanoparticles on the substrate, and sinter the nanoparticles.

The carrier fluid delivery mechanism may comprise a printing apparatus.

The printing apparatus may comprise an inkjet printer.

The electric field source may comprise a planar electrode.

The energy source may be operable to emit electromagnetic radiation in the infra-red band.

The energy source may be operable to emit electromagnetic radiation in the ultra-violet band.

The energy source may be operable to emit electromagnetic radiation in the microwave band.

The energy source may be operable to act as the source of an electric field.

The apparatus may further comprise a mould structure, wherein the mould structure is operable to contain the carrier fluid on the substrate.

The apparatus may further comprise a temperature control mechanism, wherein the temperature control mechanism is connected to control the temperature of the substrate.

The apparatus may further comprise an AC voltage source, wherein the AC voltage source is connected to the electric field source to create a non-uniform electric field.

The apparatus may further comprise a protective coating application mechanism, the protective coating application mechanism being operable to apply a protective coating to semiconductor nanoparticles.

According to the invention, there is provided apparatus comprising means for applying a carrier fluid to a substrate, the carrier fluid carrying nanoparticles, means for manipulating the positions of a plurality of the nanoparticles in the carrier fluid by applying an electric field, means for removing the carrier fluid from the substrate so as to leave the nanoparticles on the substrate and means for sintering the nanoparticles to form a region.

According to the invention, there is provided a device comprising a transistor having at least one semiconducting region, the semiconducting region being formed by applying a carrier fluid carrying semiconductor nanoparticles to a substrate and sintering the semiconductor nanoparticles.

BRIEF DESCRIPTION OF THE DRAWINGS

Embodiments of the present invention will now be described, by way of example, with reference to the accompanying drawings, in which:

FIG. 3 is a side view of a separation process comprising the application of an electric field to a carrier fluid comprising semiconductor nanoparticles.

FIG. 9A is a side view of a separation process comprising the application of an electric field to a carrier fluid comprising semiconductor nanoparticles.

DETAILED DESCRIPTION OF EMBODIMENTS OF THE INVENTION

Figure 1:
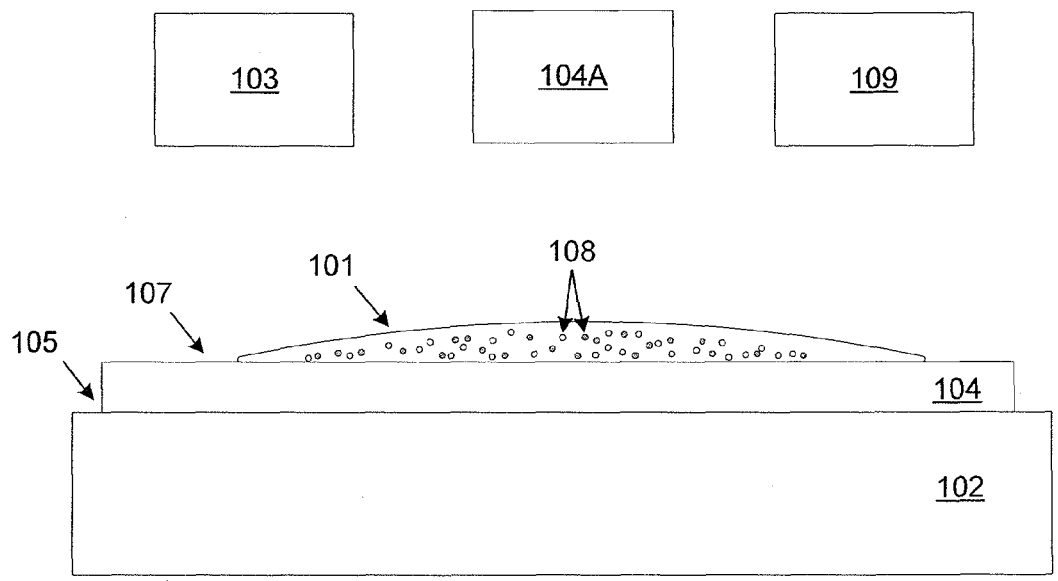
FIG. 1 is a side view of a carrier fluid applied to an upper surface of a substrate.

Referring to FIG. 1, a carrier fluid 101 is applied to a substrate 102 by a delivery mechanism 103. The substrate 102 may comprise, for example, a foil formed from stainless steel or plastics. Alternatively, the substrate 102 may comprise a conventional silicon substrate. The delivery mechanism 103 may comprise a precise printing device, such as an ink-jet printer, which applies the carrier fluid 101 to the substrate 102 by ink-jet printing. However, alternatively, the printing device may apply the carrier fluid 101 by, for example, offset lithographic printing, gravure, reverse gravure, spraying or digital offset printing.

The carrier fluid 101 comprises liquid n-tetradecane ($C_{14}H_{30}$) and contains a plurality of semiconductor nanoparticles. An alternative carrier fluid 101 could comprise, for example, liquid dimethyl siloxane. Aqueous or non-aqueous liquids could be used.

A uniform layer of dielectric material 104, such as silicon dioxide, is applied to the surface 105 of the substrate 102 by a suitable application mechanism 104A using a known method. For example, the uniform layer of dielectric material 104 may be created using a spin-casting process in which a solution of the dielectric material 104 is applied to the substrate 102 in a solvent, and the substrate 102 is rotated at high speed to remove excess solution. The solvent is then evaporated to leave a layer of dielectric material, which may be sintered or annealed to create the uniform layer of dielectric material 104 shown in FIG. 1.

Therefore, more specifically, the application of the carrier fluid 101 is to the surface 107 of the dielectric material 104.

The application of the carrier fluid 101 to the dielectric material 104 provides a method of accurately depositing semiconductor nanoparticles onto the substrate 102. The position of the nanoparticles on the surface 107 of the dielectric material 104 is restricted to the area of the surface 107 occupied by the carrier fluid 101. A suitable surface treatment chemical is applied to the dielectric material 104 such that the surface 107 onto which the carrier fluid 101 is applied is highly hydrophobic. Accordingly, the contact angle of the carrier fluid 101 with the surface 107 of the dielectric material 104 is greater than 90 degrees, as shown in FIG. 1. The area of dielectric material 104 occupied by the carrier fluid 101 is therefore restricted.

The skilled reader will appreciate that the properties of the surface treatment chemical applied to the surface 107 of the dielectric material 104 will substantially determine the contact angle observed between the carrier fluid 101 and the dielectric material 104. Thus, through the application of different surface treatment chemicals to the dielectric material 104, the area of dielectric material 104 covered by a given volume of carrier fluid 101 may be altered.

The semiconductor nanoparticles 108 comprise inorganic elements, such as silicon or germanium, and have a diameter of less than 20 nanometres. The nanoparticles 108 may comprise semiconductor alloys, for example IV-IV semiconductors such as SiC or III-V semiconductors such as GaAs or InGaAs. The nanoparticles may alternatively comprise semiconducting polymers. The nanoparticles 108 in the carrier fluid 101 may also be doped by conventional means to be either n-doped nanoparticles or p-doped nanoparticles.

The positions of the nanoparticles 108 within the carrier fluid 101 may be manipulated in a separation process. The separation process is implemented after the carrier fluid 101 has been applied to the dielectric material 104, and utilises an applied electric field to move the nanoparticles 108 within the fluid 101. The separation process may comprise the application of an electric field at the surface 107 of the dielectric material 104 so as to drive the nanoparticles 108 towards specific areas of the carrier fluid 101.

Figure 2:
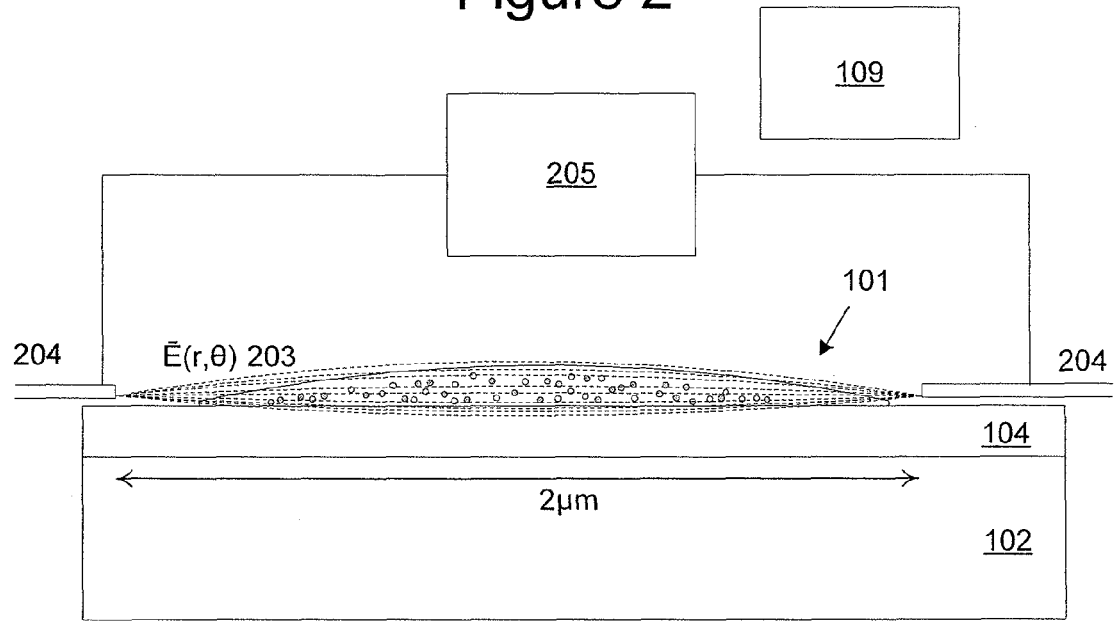
FIG. 2 is a side view of a carrier fluid comprising semiconductor nanoparticles applied to an upper surface of a substrate.

A general example of such a separation process is shown in FIG. 2 and FIG. 3. In this example, the nanoparticles 108 comprise both n-doped nanoparticles 201 and p-doped nanoparticles 202. A non-uniform electric field 203 is applied across the surface 107 of the dielectric material 104 by electrodes 204 so as to exert a dielectrophoretic force (DEP force) on each of the nanoparticles 108. The electrodes 204 may comprise, for example, planar electrodes, simple gap electrodes, castellated electrodes, quadrupole electrodes, flat surface electrodes or sharp pin electrodes. As a further alternative, the electrodes may comprise carbon nanotubes.

The structure of the electrodes is discussed in more detail in the specific examples of the invention given below, particularly in relation to FIGS. 7C to 7E. The electrodes 204 may be fabricated from a conductive metallic material, for example gold or aluminium, and may be coated with a non-stick material such as silicon carbide to prevent any carrier fluid 101 from sticking to them.

Figure 9B:
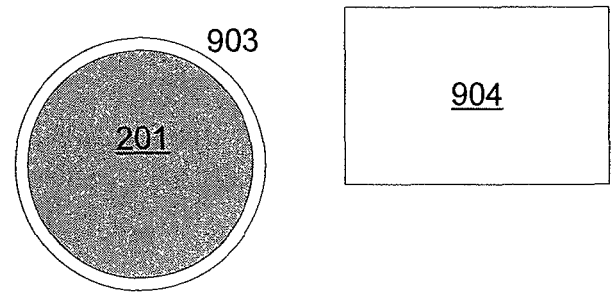
FIG. 9B is a side view of a semiconductor nanoparticle with a protective coating.

The electrodes 204 may be comprised as a part of an electrode structure (not shown), which is supported on a jig and is brought into proximity with the carrier fluid 101 during the separation process as is illustrated, by way of example, in FIG. 3 and FIG. 9A. Following the completion of the separation process, the electrodes 204 may be withdrawn.

Alternatively, the electrodes may be fabricated lithographically on the substrate 102 prior to the application of the dielectric material 104, for example using electron beam lithography, and integrated into the structure below the lower surface of the dielectric material 104. This type of electrode is discussed further in relation to FIGS. 7C to 7E and is the type of electrode structure used in the first and second examples of the invention discussed below.

The electric field 203 is generated by an AC voltage source 205. The electric field 203 may, however, alternatively be generated by a DC voltage source.

The DEP force is a translational force acting on the nanoparticles 108 and is dependent on the nanoparticles' polarization in the electric field 203.

The polarization of the nanoparticles 108 and hence the net force experienced by the nanoparticles 108 is dependent on the polarizability of the nanoparticles 108, the polarity of the carrier fluid 101 and the frequency of the electric field 203. The net force experienced by each nanoparticle 108 is also dependent on the conductivity of the carrier fluid 101.

In the electric field 203, nanoparticles 108 whose polarizability is greater than that of the carrier fluid 101 experience positive dielectrophoresis and move towards regions of the carrier fluid 101 where the electric field strength is highest. Nanoparticles 108 whose polarizability is less than that of the carrier fluid 101 experience negative dielectrophoresis and move toward regions of the carrier fluid 101 where the strength of the electric field 203 is lowest.

The polarizability of each nanoparticle 108 and hence the DEP force experienced by each nanoparticle 108 in the electric field 203, is dependent on each nanoparticle's dielectric properties, and on other factors such as the nanoparticle's shape and size, the Clausius-Mosotti factor, the viscosity of the carrier fluid 101, the concentration of the nanoparticles 108 in the carrier fluid 101 and the temperature at which the separation process is carried out. Example values for these parameters are given below in relation to the specific examples of the invention.

If desired, the dielectric properties, shape and size of all or some of the nanoparticles 108 may be altered by applying a suitable protective monomer or polymer coating to their surface. This process is discussed in more detail below in relation to FIG. 4 and FIG. 9.

The temperature of the substrate 102 and dielectric material 104 is controlled by a temperature control mechanism 109. The temperature control mechanism 109 may comprise a thermal chuck, which includes a heating element operable to increase the temperature of the substrate 102 and dielectric material 104. The temperature of the substrate 102 and dielectric material 104 is kept low at the point of application of the carrier fluid 101 to the dielectric material 104. For example, if the carrier fluid 101 comprises n-tetradecane, the temperature of the substrate 102 and dielectric material 104 is held between 280 and 281 degrees Kelvin such that the carrier fluid 101 becomes substantially frozen when applied to the surface 107 of the dielectric material 104. The spread of the carrier fluid 101 on the dielectric material 104 and the speed of movement of the nanoparticles 201,202 within the carrier fluid 101 is therefore restricted by the low temperature and may thus be carefully controlled following the carrier fluid's application.

The temperature of the substrate 102 and dielectric material 104 can be increased or decreased by the temperature control mechanism 109, thus enabling accurate control of the amount of time taken for the completion of the separation process. If the carrier fluid 101 comprises n-tetradecane, the separation process is carried out in the temperature range between 290 and 325 degrees Kelvin and has a duration of 5 seconds or less.

Referring to FIGS. 2 and 3, as previously discussed, the carrier fluid 101 contains both n-doped nanoparticles 201 and p-doped nanoparticles 202 with a diameter of less than 20 nm. The n-doped nanoparticles 201 are all within a particular, narrow size range and are of substantially the same elemental or compound material structure such that they exhibit substantially the same dielectric properties. Accordingly, when subjected to the non-uniform electric field 203 of particular amplitude, frequency and direction, the n-doped nanoparticles 201 all experience substantially the same DEP force.

The p-doped particles 202 are also within a particular, narrow size range and are composed of the same elemental or compound structure as each other. As with the n-doped nanoparticles discussed above, the p-doped particles 202 experience substantially the same DEP force as one another when subjected to the non-uniform electric field 203.

The strength of the applied electric field 203 is in the range between $10^5$ V/m and $10^7$ V/m, depending on the polarizability of the particles 201,202 and the distance between the electrodes 204. The frequency of the electric field is in the range between 10 Hz and 5 GHz. Example values for these parameters are given in the detailed examples of the invention given below.

The dielectric properties, size and shape of the n-doped nanoparticles 201 are compared with those of the p-doped nanoparticles 202, and the differences between the attributes of the two groups 201,202 are taken into account in order to select the frequency of the electric field 203 and conductivity of the carrier fluid 101. As discussed above, in this example, the carrier fluid 101 comprises n-tetradecane.

In this way, application of the electric field 203 results in the DEP force experienced by the n-doped nanoparticles 201 being substantially different to the DEP force experienced by the p-doped nanoparticles 202. This effect can be increased or decreased by the addition of a protective monomer or polymer coating to the nanoparticles, as mentioned above and discussed in more detail in relation to FIGS. 4B and 9B below. The protective coating may comprise, for example, latex, an amino acid or other suitable monomers or polymers.

Consequently, the n-doped nanoparticles 201 are separated from the p-doped nanoparticles 202 in the carrier fluid 101 as shown by FIG. 3. In order to clearly show the separation process, the electrodes 204 shown in FIG. 3 are located above the dielectric material 104. However, the electrodes could alternatively be located below the surface of the dielectric material 104, as is discussed in more detail in relation to the to the first and second examples of the invention below.

In the example of FIG. 3, the n-doped nanoparticles 201 substantially experience positive dielectrophoresis and move towards the area of the carrier fluid 101 where the strength of the electric field 203 is highest. The p-doped nanoparticles 202 substantially experience negative dielectrophoresis and move towards the area of the carrier fluid 101 where the strength of the electric field 203 is lowest.

A first example of the invention will now be described specifically in relation to the fabrication of the semiconductor structures of an np diode and an NMOS transistor.

Figure 4A:
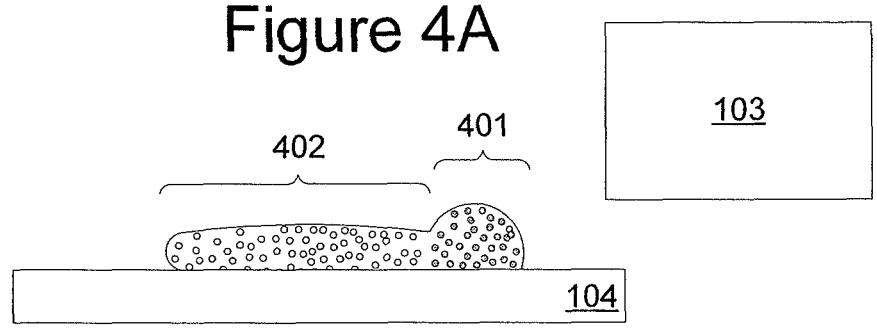
FIG. 4A is a side view of semiconductor nanoparticles in a carrier fluid divided into an n-region and a p-region under the influence of an electric field.
Figure 4B:
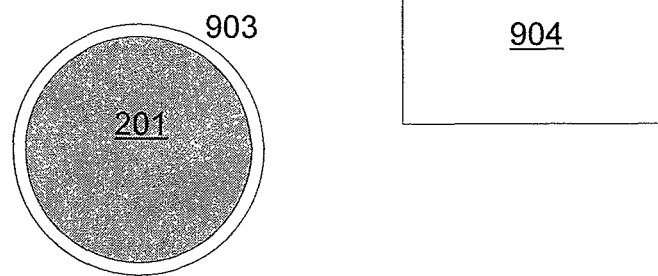
FIG. 4B is a side view of a semiconductor nanoparticle with a protective coating.

Referring to FIG. 4A, a plurality of semiconductor nanoparticles 201,202 comprise both n-doped semiconductor nanoparticles 201 and p-doped semiconductor nanoparticles 202 with diameters of approximately 15 nm.

Figure 14:
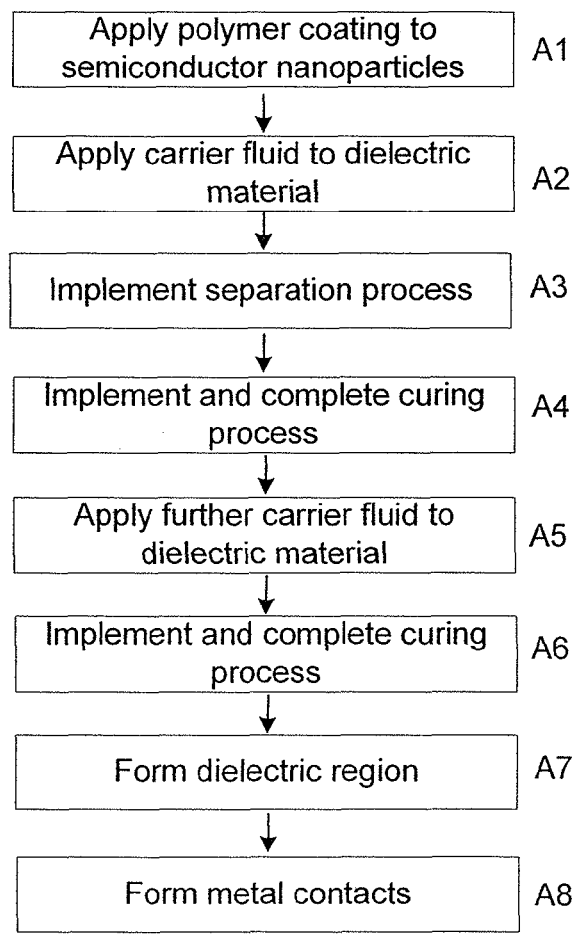
FIG. 14 is a flow diagram showing the steps of a method for fabricating the semiconductor structure of a MOS transistor.

The nanoparticles 201,202 are contained within a carrier fluid 101, which comprises liquid n-tetradecane. The conductivity of the carrier fluid 101 is approximately 20,000 S/m The dielectric properties, shape and size of the semiconductor nanoparticles 201,202 are within a narrow range. Therefore, referring to FIG. 4B and FIG. 14, in order to facilitate an effective separation process with the p-doped nanoparticles 202, the n-doped semiconductor nanoparticles 201 are coated, in step A1, with a protective coating 903 by an application mechanism 904.

The protective coating 903 comprises latex and substantially affects the shape, size and dielectric properties of the nanoparticles 201 to which it is adhered. The addition of the protective coating 903 may cause the diameter of the nanoparticles 201 to exceed 20 nm. An alternative protective coating 903 may comprise, for example, an amino acid.

In step A2, the carrier fluid 101 is applied to the surface 107 of the dielectric material 104 in a pattern corresponding to the configuration of an np diode structure. During application of the carrier fluid 101, the temperature control mechanism 109 maintains the temperature of the surface 107 of the dielectric material 104 between 280 and 281 degrees Kelvin such that the carrier fluid 101 becomes substantially frozen. The dielectric material 104 comprises a uniform layer of silicon dioxide, as previously discussed.

In step A3, a separation process, such as the dielectrophoretic separation process described above in relation to FIGS. 2 and 3, is employed such that the n-doped nanoparticles 201 flow into an n-region 401 of the carrier fluid 101 and the p-doped nanoparticles 202 flow into a p-region 402 of the carrier fluid 101. The separation process is carried out at approximately 300 degrees Kelvin and has a duration of 5 seconds or less. The resulting n-region 401 and p-region 402 are clearly shown in FIG. 4A.

In this example the electrodes 204 used to manipulate the positions of the nanoparticles 201,202 are separated by a distance of 2 μm. The frequency of the applied non-uniform electric field 203 is 20 MHz with a peak-to-peak voltage of 10 Vpp. The field force is thus approximately 2.5 MV/m.

Figure 4C:
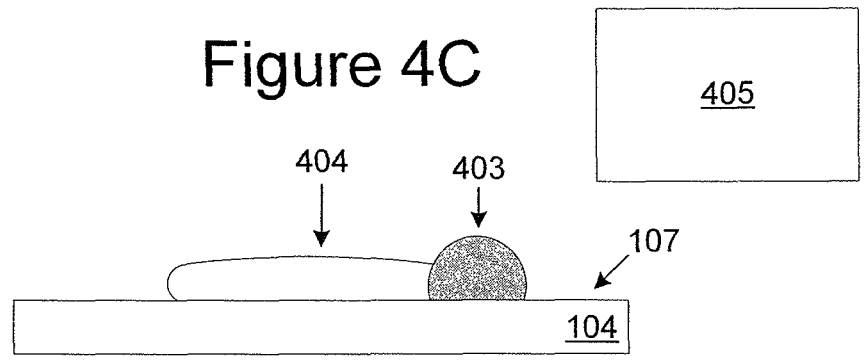
FIG. 4C is a side view of an n-type semiconducting material and a p-type semiconducting material on an upper surface of a substrate.

Once the separation process has been completed, the n-region 401 and p-region 402 are cured in step A4. In the curing process the carrier fluid 101, substrate 102 and semiconductor nanoparticles 201,202 are exposed to an energy source 405 so as to vaporise the carrier fluid 101 and sinter the nanoparticles 201,202 to form a coherent n-type semiconducting material 403 and a coherent p-type semiconducting material 404 as shown in FIG. 4C. The carrier fluid 101 is vaporized at approximately 526 degrees Kelvin. The energy source comprises a heat source, which emits electromagnetic radiation in the infra-red band. However, the energy source 405 may alternatively comprise an ultra-violet radiation source or a microwave radiation source. As a further alternative, the energy source 405 may comprise an electric field source. In addition, variation between the properties of the n-doped nanoparticles 201 and p-doped nanoparticles 202 may require that the n-doped nanoparticles 201 and p-doped nanoparticles 202 be sintered during separate time intervals, at different temperatures.

The protective coating 903 applied to the semiconductor nanoparticles 201 is also removed during the curing process; the protective coating 903 is melted and vaporized by the energy source 405. Alternatively, the coating may be removed from the nanoparticles by the addition of a suitable chemical fluid to the carrier fluid 101, before being vaporized by the energy source 405. The parameters of the non-uniform electric field 203 may be modified at this stage so as to aid the various steps of the curing process outlined above. For example, DEP forces may be employed to aid the removal of the protective coating 903 or to aid in the sintering of the nanoparticles 201,202.

Figure 5:
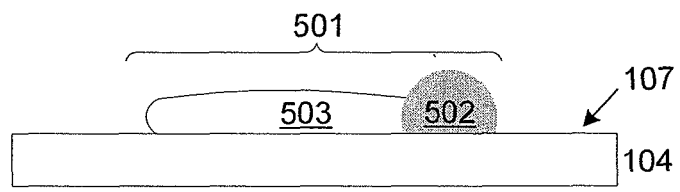
FIG. 5 is a side view of a semiconductor structure, including an n-region and a p-region, on an upper surface of a substrate.

During the curing process, the semiconducting material 403,404 bonds with the dielectric material 104 in the positions to which the nanoparticles 201,202 were driven during the separation process. The result is thus the formation of the semiconductor structure 501 of an np diode, as shown in FIG. 5. The semiconductor structure 501 includes an n-region 502, corresponding to the position of the sintered n-type semiconducting material 403, and a p-region 503 which corresponds to the position of the sintered p-type semiconducting material 404. Once the curing process has been completed, the electric field 203 is switched off.

Alternatively, the electric field 203 may be switched off immediately following the vaporization of the carrier fluid 101, since at this stage the positions of the nanoparticles 201,202 will no longer be subject to any significant change.

Figure 6A:
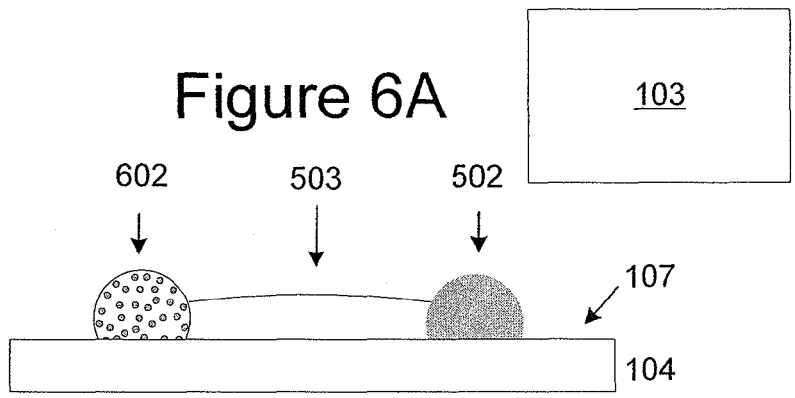
FIG. 6A is a side view of a semiconductor structure and a carrier fluid comprising semiconductor nanoparticles on an upper surface of a substrate.

Referring to FIG. 6A, the np diode structure 501 may be used as a basis for fabrication of a further semiconductor structure 601, which is suitable for use in an NMOS transistor. The further semiconductor structure 601 is fabricated by the application, in step A5, of a further carrier fluid 602 to the surface 107 of the dielectric material 104 at a position adjacent to the p-region 503 of the diode structure 501. In this example, the further carrier fluid 602 comprises n-tetradecane.

During the application of the further carrier fluid 602, the temperature control mechanism 109 maintains the temperature of the dielectric material between 280 and 281 degrees Kelvin. The application of the further carrier fluid 602 is carried out using a delivery mechanism 103 such as an inkjet printer, in the manner previously discussed. The further carrier fluid 602 contains further n-doped semiconductor nanoparticles 201 with a diameter of approximately 15 nm.

The further n-doped nanoparticles 201 are coated with a protective coating 903 comprising latex. This coating substantially affects the shape, size and dielectric properties of the further n-doped nanoparticles 201 to which it is adhered and may cause the diameter of the further n-doped nanoparticles 201 to exceed 20 nm. An alternative protective coating 903 may comprise, for example, an amino acid.

Figure 6B:
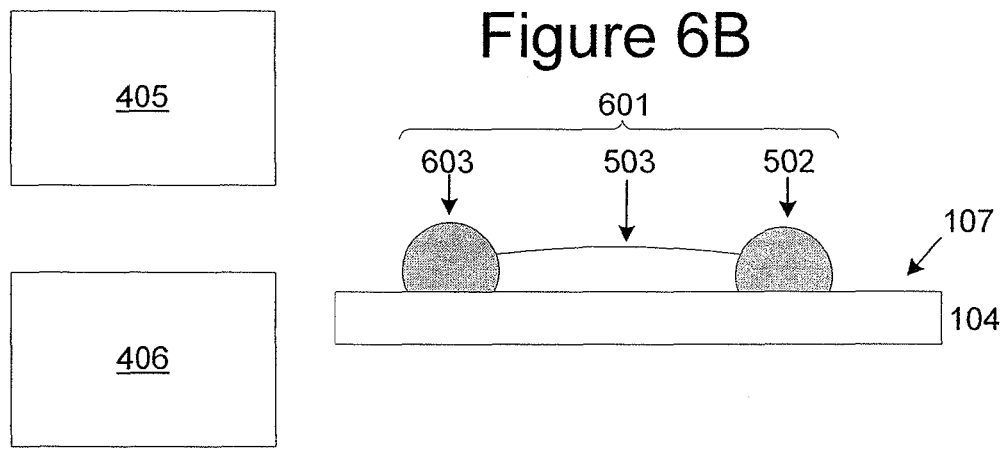
FIG. 6B is a side view of a semiconductor structure, including two n-regions and a p-region, on an upper surface of a substrate.

Once applied to the dielectric material 104, the further carrier fluid 602 is cured, in step A6, in the manner described above in relation to step A4, to form a further coherent n-type semiconducting material 603 on the surface 107 of the dielectric material 104, as shown in FIG. 6B.

Figure 7A:
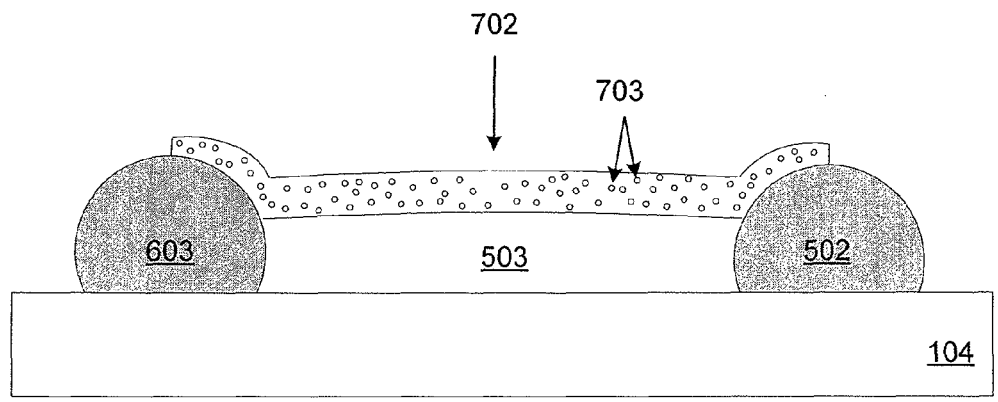
FIG. 7A is a side view of a semiconductor structure and a carrier fluid comprising nanoparticles of a dielectric material.
Figure 7B:
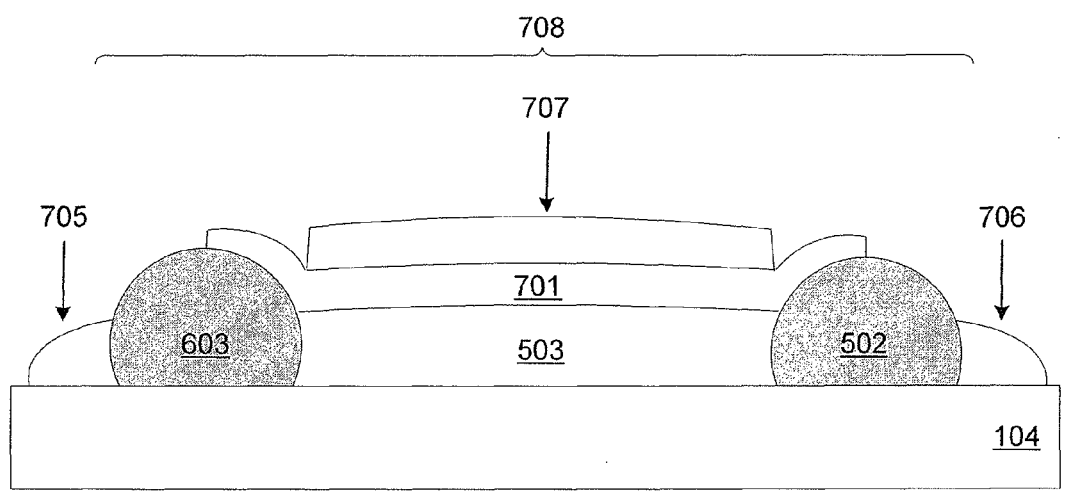
FIG. 7B is a side view of a semiconductor structure having a dielectric region and metal contacts.

Referring to FIGS. 7A and 7B, following the formation of the further coherent n-type semiconducting material 603, step A7 comprises the formation of a dielectric region 701 on the upper surface of the n-type and p-type materials 502,503,603. In this example, the dielectric region 701 is formed by applying a further carrier fluid 702, containing nanoparticles 703 of a suitable dielectric material, such as silicon dioxide, to the surface of the n- and p-materials 502,503,603 using a delivery mechanism 103 such as an inkjet printer, as previously discussed. The positions of the dielectric nanoparticles 703 may be manipulated within the fluid 702 by dielectrophoresis and a curing process may be employed to make the dielectric region 701 permanent. Alternatively, the dielectric region 701 may comprise other suitable electrical insulators and may be applied by any other suitable technique.

In step A8, metal contacts 705,706 are formed on the surface 107 of the dielectric material 104 adjacent to the coherent n-materials 502,603. A further metal contact 707 is formed on the upper surface of the dielectric region 701. The contacts 705,706,707 may be formed, for example, by the application of a conductive nano-ink using a suitable accurate delivery mechanism 103 such as an inkjet printer as previously discussed. Alternatively, the contacts 705,706,707 may be formed by any other conventional means. In this example, the metal contacts 705,706,707 comprise aluminium contacts.

The metal contacts 705,706,707 act as source, drain and gate contacts for an NMOS transistor 708, as shown in FIG. 7B.

Figure 7C:
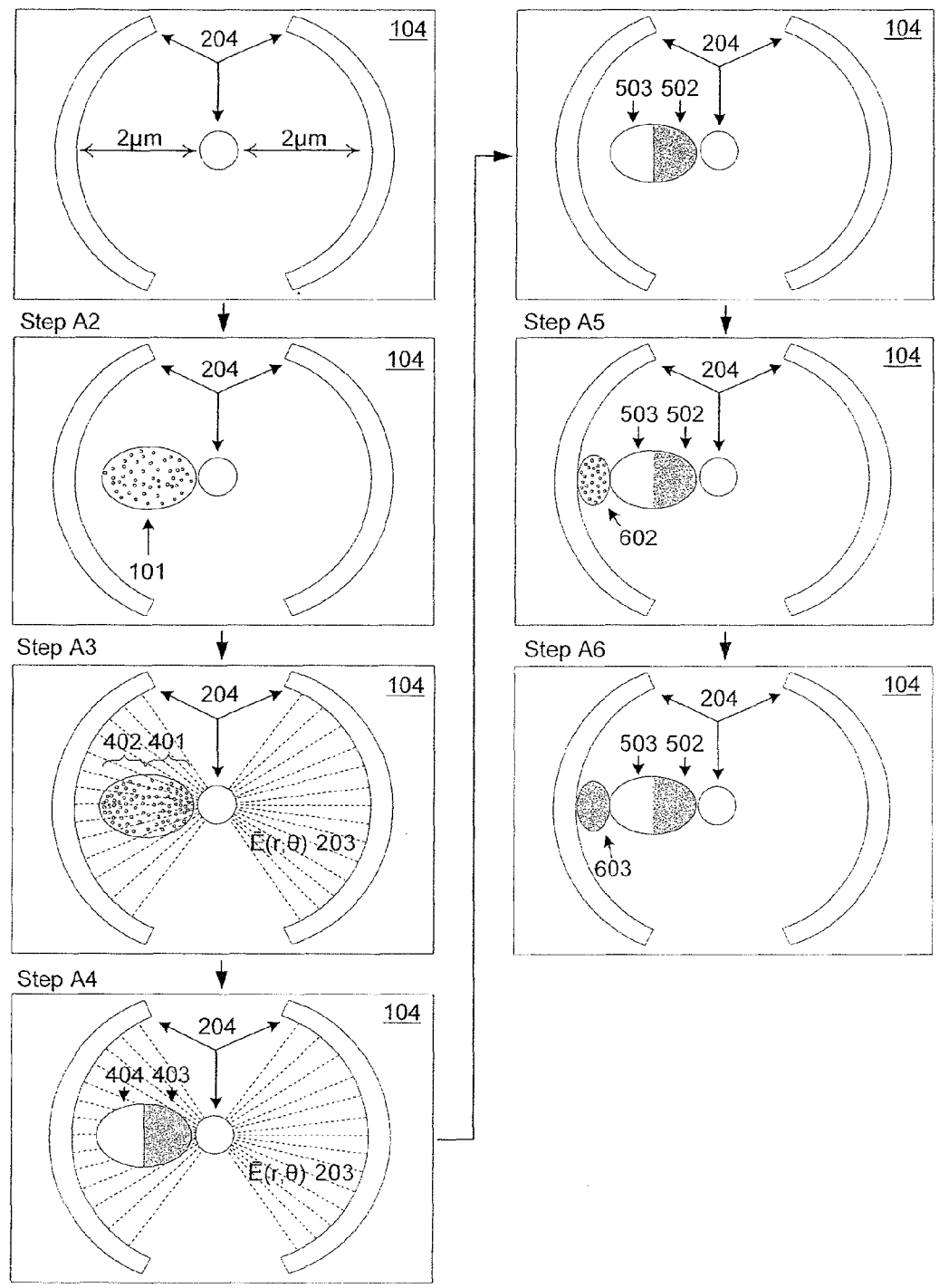
FIG. 7C is a set of plan views showing an electrode structure beneath a dielectric material on a substrate, and the stages of applying nanoparticles to the substrate, manipulating the positions of the nanoparticles with an electric field and sintering the nanoparticles.

The above-described stages of fabricating the semiconductor structure 601 for the NMOS transistor 708 are shown together in FIG. 7C. FIG. 7C also illustrates an example electrode structure in plan view, which comprises two arc-shaped electrodes 204 and a central electrode 204. The arc-shaped electrodes 204 are of equal diameter and are each spaced 2 microns from the central electrode 204. The position of the central electrode 204 is such that, if the arc-shaped electrodes were extended into complete circles, the central electrode 204 would be located at the centre of both circles.

Figure 7D:
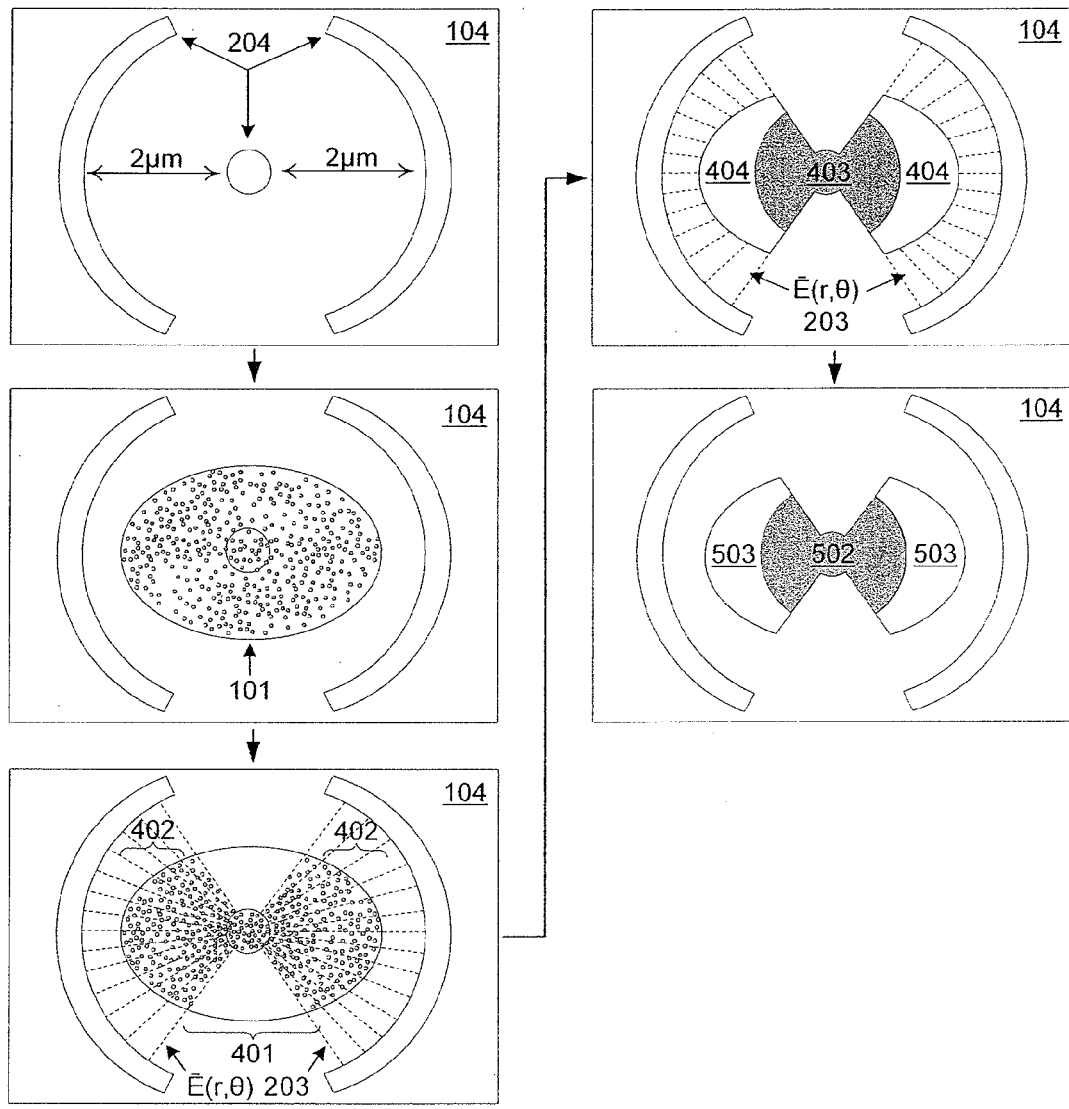
FIG. 7D is a further set of plan views showing an electrode structure beneath a dielectric material on a substrate, and the stages of applying nanoparticles to the substrate, manipulating the positions of the nanoparticles with an electric field and sintering the nanoparticles.
Figure 7E:
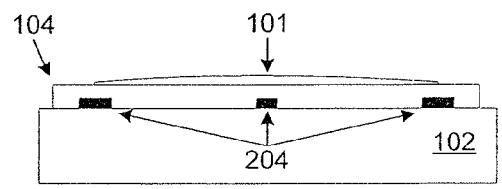
FIG. 7E is a cross-sectional side view of the electrodes beneath the surface of a dielectric material on a substrate.

The electrodes 204 shown in FIG. 7C are fabricated lithographically, as previously discussed, and are located below the surface of the dielectric material 104, as illustrated by FIG. 7E.

A further example method of fabricating the semiconductor structure 601 using this electrode structure is shown in FIG. 7D. The method is similar to that shown in FIGS. 4 to 7C, but differs in that it involves only a single application of carrier fluid 101. The carrier fluid 101 comprises both n-doped nanoparticles 201 and p-doped nanoparticles 202 and is applied radially between the two arc electrodes 204, such that it spans the central electrode 204.

The positions of the nanoparticles 201,202 are then manipulated within the carrier fluid by the application of the electric field 203 to form an n-region 401 sandwiched between two p-regions 402. The separation of the nanoparticles 201,202 is carried out in a single dielectrophoretic separation process, where the n-doped particles 201 flow towards the central electrode 204 (where the strength of the E field 203 is highest) and the p-doped particles 202 flow towards the surrounding arc electrodes 204 (where the strength of the E field is lowest.)

The skilled person will appreciate that the diode structure 501 could alternatively be used as the basis of the structure of a PMOS transistor. Additionally, npn or pnp bipolar transistors could be formed by omission of the dielectric region 701. The skilled person will also appreciate that the above-described technique could be used to fabricate a wide variety of semiconductor structures and active components, and is not limited to the fabrication of diodes and transistors.

A second example of the invention will now be described by reference to the fabrication of the semiconductor structure of a further MOS transistor.

Figure 8:
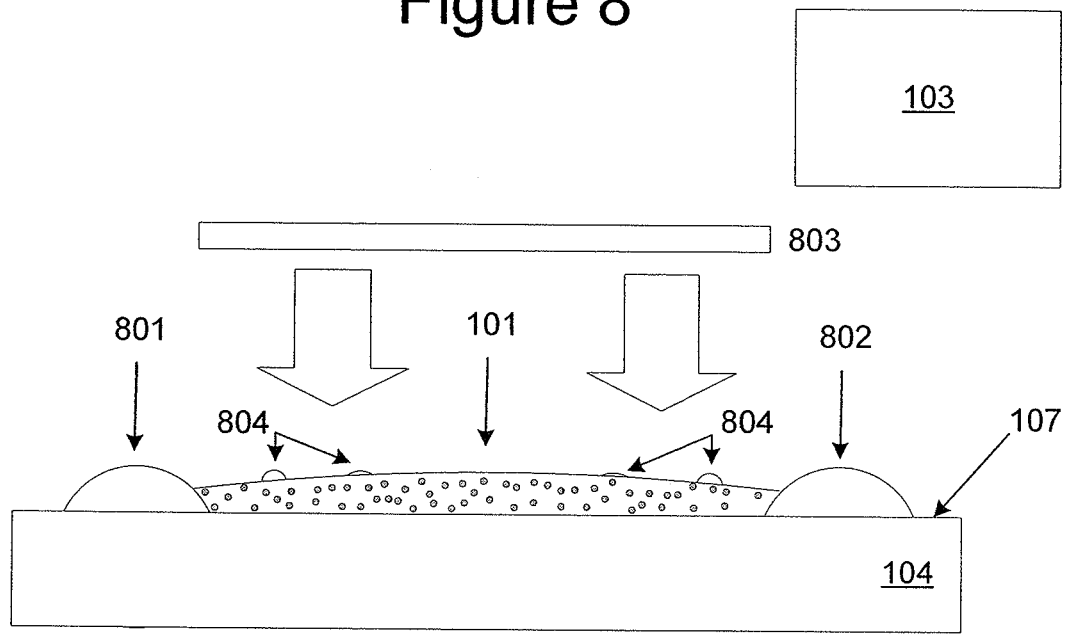
FIG. 8 is a side view of a carrier fluid comprising semiconductor nanoparticles in between metal contacts on an upper surface of a substrate.

Referring to FIG. 8, a plurality of semiconductor nanoparticles 201 comprise n-doped semiconductor nanoparticles 201 with diameters of approximately 15 nm.

The nanoparticles 201 are contained within a carrier fluid 101, which comprises liquid n-tetradecane. The conductivity of the carrier fluid 101 is approximately 20,000 S/m The dielectric properties, shape and size of the semiconductor nanoparticles 201 are within a narrow range. Therefore, referring to FIG. 9B and FIG. 15, in order to facilitate an effective separation process, a first half 901 of the n-doped semiconductor nanoparticles 201 are coated, in step B1, with a protective coating 903 by an application mechanism 904.

The protective coating 903 comprises latex and substantially affects the shape, size and dielectric properties of the nanoparticles 201 to which it is adhered. The addition of the protective coating 903 may cause the diameter of the nanoparticles 201 to exceed 20 nm. An alternative protective coating 903 may comprise, for example, an amino acid.

The second half 902 of the nanoparticles 201 remain uncoated so that the dielectric properties, shape and size of the nanoparticles 201 in the first and second halves 901,902 are substantially different to each other. Alternatively, this effect could be achieved by applying a different protective coating to the second half 902 of the nanoparticles 201.

Figure 15:
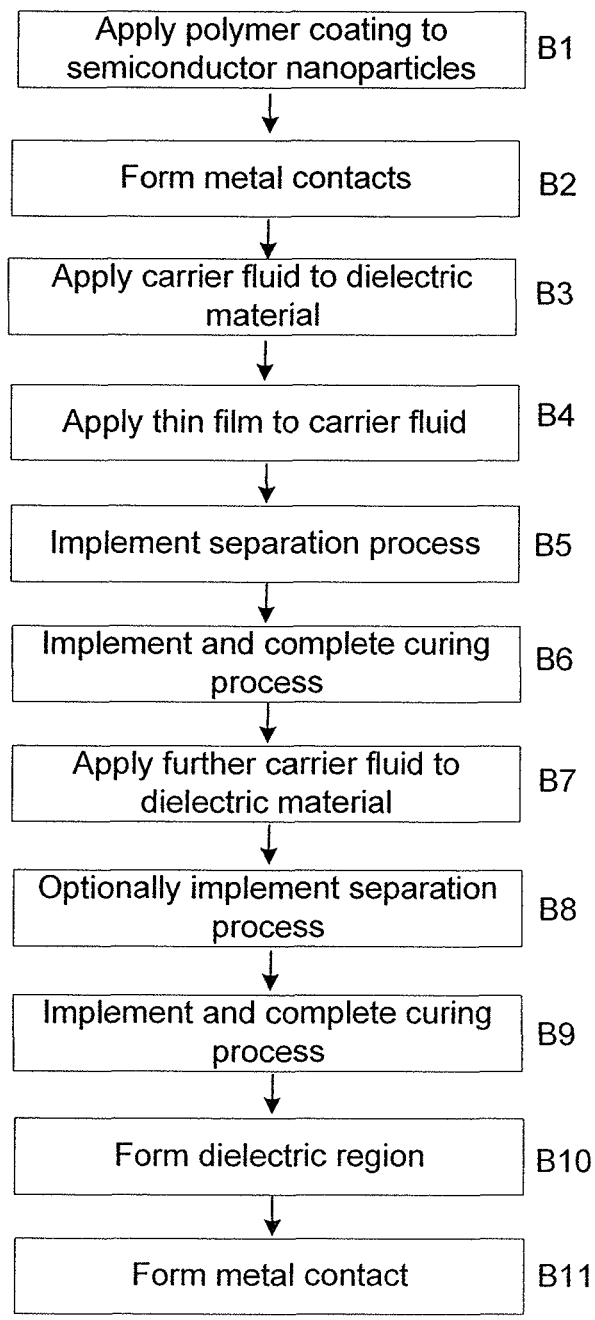
FIG. 15 is a further flow diagram showing the steps of a method for fabricating the semiconductor structure of a MOS transistor.

Referring to FIG. 8 and FIG. 15, step B2, the surface 107 of the dielectric material 104 is provided with first and second metal contacts 801,802 comprising aluminium. The metal contacts 801,802 are formed prior to the application of the carrier fluid 101, and may be formed using, for example, a conductive nano-ink in a printing process, as discussed above.

In this example, as shown by FIG. 8, the carrier fluid 101 contains only n-doped nanoparticles 201. However, alternatively, the carrier fluid 101 may contain only p-doped nanoparticles 202. As shown in FIG. 15, step B3, the carrier fluid 101 is applied to the surface 107 of the dielectric material 104, which comprises silicon dioxide, in between the metal contacts 801,802. During the application of the carrier fluid 101, the temperature control mechanism 109 maintains the temperature of the dielectric material 104 between 280 and 281 degrees Kelvin. The carrier fluid 101 is applied by a delivery means 103 such as an inkjet printer.

In the event that the surface tension of the carrier fluid 101 causes it not to spread to a uniform layer on the surface 107 of the dielectric material 104, in step B4 a film 803, comprising for example a glass or dielectric material, is placed over the carrier fluid 101 in order to break the tension. The film 803 is prevented from restricting the movement of the semiconductor nanoparticles 201 by small dots of suitable material 804, which act as spacers. In this example, the dots comprise a hardened glue and are applied to the dielectric material 104 prior to the application of the carrier fluid 101.

Referring to FIG. 9A, in step B5, a separation process is employed to separate the n-doped semiconductor nanoparticles 201 into first and second n-type nanoparticle populations 901,902, which overlap the first and second metal contacts 801,802.

The separation process of step B5 is preferably the same as that of step A3 discussed above. The separation process may comprise, for example, a dielectrophoretic separation process.

As with FIG. 3, FIG. 9A shows the electrodes 204 located above the surface of the dielectric material 104 in order to clearly illustrate the separation process. However, in this example, the electrodes 204 are actually fabricated lithographically and located below the dielectric material 104 as described in relation to FIGS. 7C and 7D, and shown in FIG. 7E. The electrodes 204 are separated by a distance of 2 µm and comprise two arc shaped electrodes 204 surrounding a central electrode 204, as described above in relation to FIGS. 7C and 7D. The frequency of the applied non-uniform electric field 203 is 20 MHz with a peak-to-peak voltage of 10 Vpp. The field force is thus approximately 2.5 MV/m.

As discussed above, the dielectric properties of the first half 901 of the nanoparticles 201 are substantially different to the dielectric properties of the second half 902 of the nanoparticles 201. This causes the two halves 901,902 of the nanoparticles 201 to experience substantially different DEP forces when subjected to the non-uniform electric field 203. The semiconductor nanoparticles 201 are thus substantially separated into two n-type populations 901,902 by the action of DEP forces.

As shown by FIG. 9A, the second half 902 of the semiconductor nanoparticles substantially experience positive dielectrophoresis and the first half 901 of the nanoparticles substantially experience negative dielectrophoresis. The number of nanoparticles 201 left in the region in between the two n-type populations 901,902 is kept to a minimum by appropriate selection of the concentration of nanoparticles in the carrier fluid 101.

The skilled person will appreciate that the application of protective coatings could be used to aid the division of the nanoparticles 201 into more than two groups if desired.

Figure 10:
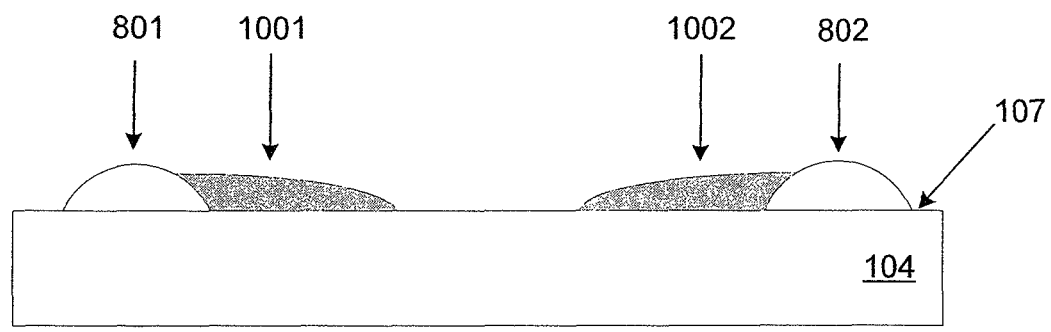
FIG. 10 is a side view of a semiconductor structure including two n-regions.

Referring to FIGS. 9A and 10, in step B6, the n-type nanoparticle populations 901,902 are sintered in a curing process, which is the same as that described in relation to the first example of the invention above. The curing process is performed, as described in relation to step A4, to form first and second coherent n-type semiconducting materials 1001, 1002 on the surface 107 of the dielectric material 104. The first and second coherent n-type materials 1001,1002 overlap the first and second metal contacts 801,802 respectively. Once the curing process has been completed, the electric field 203 is switched off.

Figure 11A:
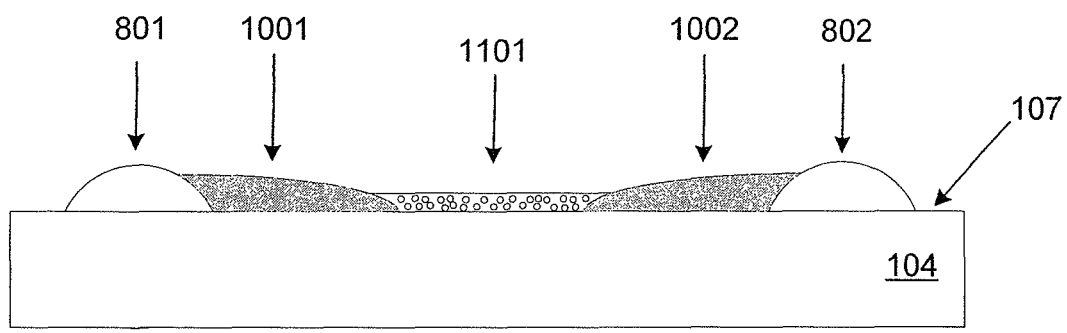
FIG. 11A is a side view of a carrier fluid comprising semiconductor nanoparticles in between n-regions of a semiconductor structure.

Referring to FIG. 11A and FIG. 15, step B7, a further carrier fluid 1101 is applied to the surface 107 of the dielectric material 104 using an accurate delivery mechanism as previously discussed. During the application of the further carrier fluid 1101, the temperature control mechanism 109 maintains the temperature of the dielectric material 104 between 280 and 281 degrees Kelvin The further carrier fluid 1101 comprises n-tetradecane and contains further p-doped semiconductor nanoparticles 202, with a diameter of approximately 15 nm. The further carrier fluid 1101 is applied to the dielectric material 104 at a location in between the two coherent n-type materials 1001,1002.

If desired, in step B8, the positions of the further p-doped nanoparticles 202 may be manipulated within the further carrier fluid 1101 using a dielectrophoretic process employing the techniques already discussed.

Figure 11B:
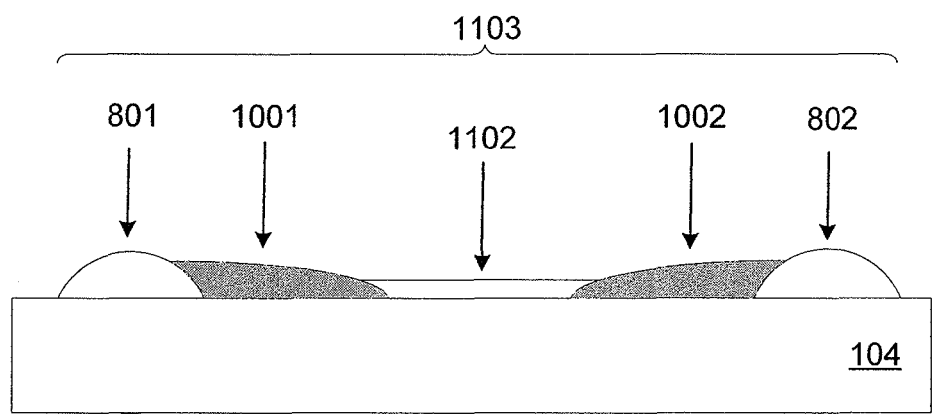
FIG. 11B is a side view of a semiconductor structure including two n-regions and a p-region.

Referring to FIG. 11B, once the positions of the further nanoparticles 201 within the further carrier fluid 1101 are satisfactory, a curing process B9 is initiated, in a manner as previously described, to form a coherent p-type semiconducting material 1102 on the surface 107 of the dielectric material 104.

Figure 12A:
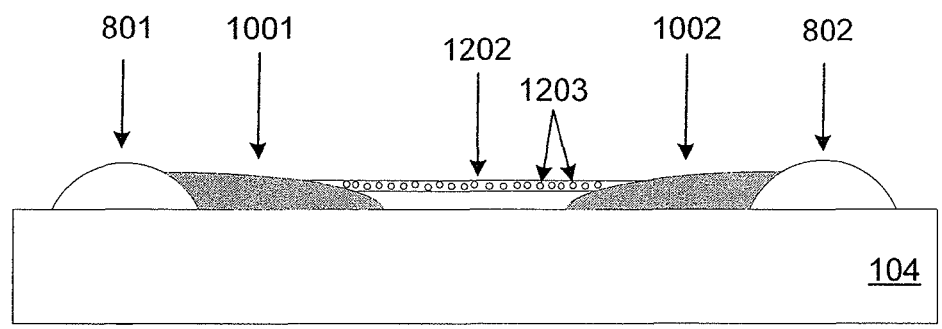
FIG. 12A is a side view of a semiconductor structure and a carrier fluid comprising semiconductor nanoparticles on an upper surface of a substrate.
Figure 12B:
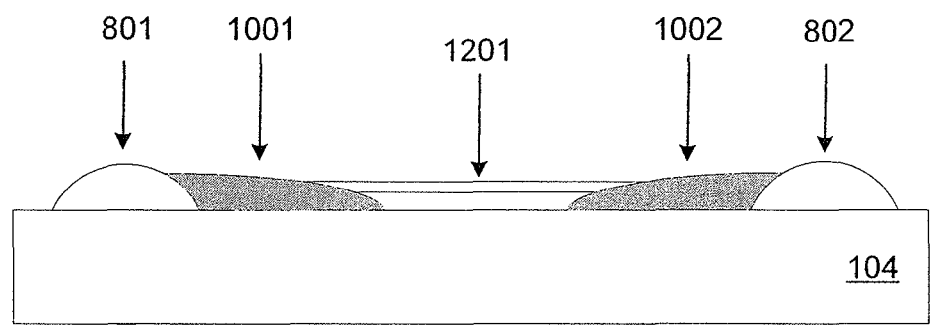
FIG. 12B is a side view of a semiconductor structure having a dielectric region.

Referring to FIGS. 12A, 12B and 15, step B10 comprises the formation of a dielectric region 1201 on the surface of the coherent p-type material 1102. The dielectric region 1201 is formed by applying a further carrier fluid 1202 containing nanoparticles 1203 of a suitable dielectric material, such as silicon dioxide, to the surface of the coherent p-type material 1102. The dielectric nanoparticles 1203 may be applied using a delivery mechanism 103 such as an inkjet printer, as previously discussed.

The positions of the dielectric nanoparticles 1203 may be manipulated within their carrier fluid 1202 by dielectrophoresis and a curing process may be employed to make the dielectric region 1201 permanent in a manner as previously described.

The properties of the nanoparticles 1203 used in the formation of the dielectric region 1201 are the same as the nanoparticles 703 used in the formation of the dielectric region 701 in step A7 of the first example of the invention. Alternatively, the dielectric region 1201 may comprise other suitable electrical insulators and be formed by any suitable technique.

Figure 13:
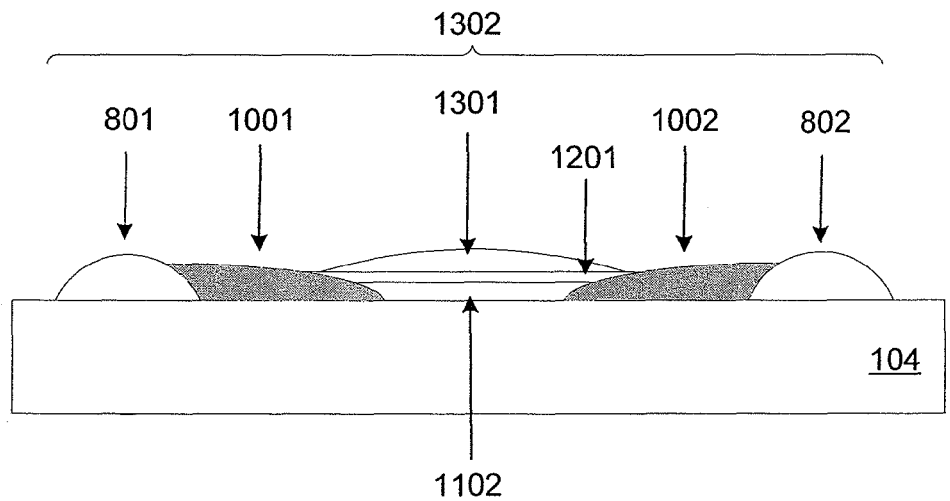
FIG. 13 is a side view of a semiconductor structure having a dielectric region and metal contacts.

Referring to FIGS. 13 and 15, in step B11, a metal contact 1301 is formed on the upper surface of the dielectric region 1201 by the application of a conductive nano-ink using a suitable delivery mechanism 103 such as an inkjet printer as previously discussed. Alternatively, the contact 1301 may be formed by any other conventional means. In this example, the metal contact 1301 comprises aluminium.

The three metal contacts 801,802,1301 described above may thus act as the source, drain and gate contacts of a MOS transistor 1302.

The formation of the gate contact 1301 in this manner enables a so-called waffle MOS structure. The MOS transistor 1302 could be used in multifinger MOS devices, where the gate areas of the MOS transistors are connected with a matrix of metal wires so as to give the lowest possible gate resistance to the devices.

The semiconductor structures described in the first and second examples of the invention could additionally be formed by an alternative implementation of the invention, which will now be described. Unless otherwise stated, the properties of the devices, values of parameters, components and substances discussed below are the same as those of the corresponding devices, values, components and substances discussed in relation to the first and second examples of the invention.

Figure 16:
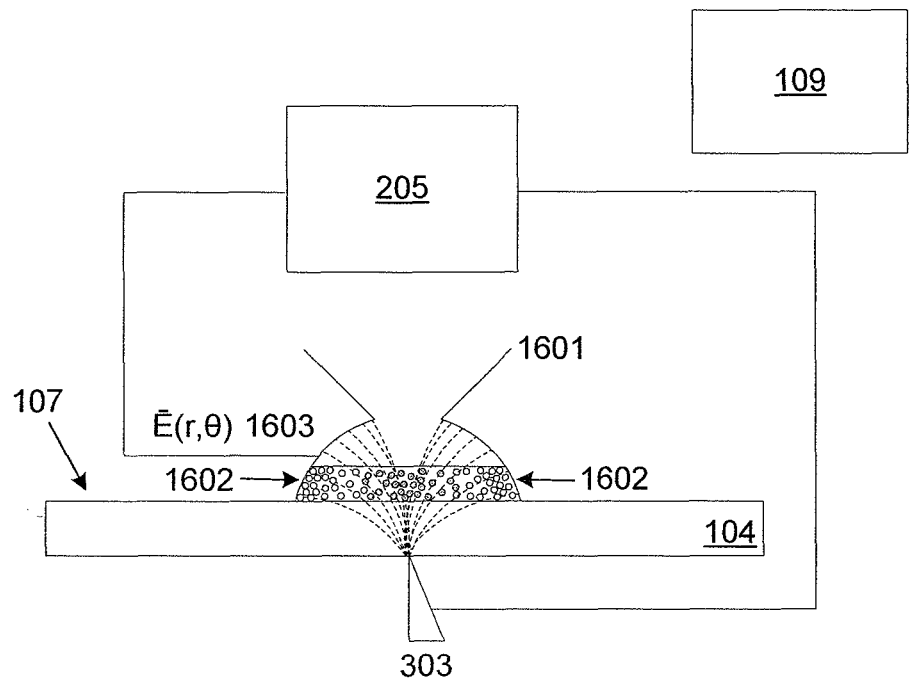
FIG. 16 is a side view of a carrier fluid within a mould structure.
Figure 20:
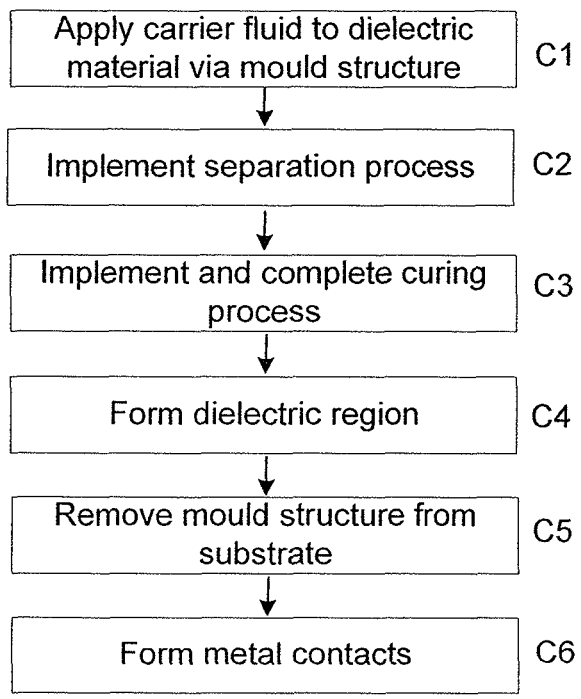
FIG. 20 is a further flow diagram showing the steps of a method for fabricating the semiconductor structure of a MOS transistor.

Referring to FIG. 16 and FIG. 20, step C1, a carrier fluid 101, as described in relation to the first or second examples of the invention, is applied to the dielectric material 104 via a mould structure 1601, which contains the carrier fluid 101 on the surface of the dielectric material 104 and restricts the carrier fluid's movement. The surface of the mould structure 1601 acts as an electrode 1602 and comprises a suitable conductive material. The surface of the mould structure 1601 is coated with silicon carbide to prevent the carrier fluid 101 from sticking to it. A further electrode 1603 is positioned under the dielectric material 104. This electrode 1603 is fabricated lithographically in a manner as discussed above.

As shown by FIG. 16, in this example the carrier fluid 101 comprises both n-doped nanoparticles 201 and p-doped nanoparticles 202. A latex protective coating 903 is applied to the n-doped nanoparticles 201 so that the dielectric properties, shape and size of the n-doped nanoparticles 201 are substantially different to those of the p-doped nanoparticles 202. In step C2, a non-uniform electric field 1604 is applied at the surface 107 of the dielectric material 104 between the electrodes 1602,1603 so as to cause a dielectrophoretic separation process as described above in relation to the first and second examples of the invention.

FIG. 16 shows that the n-doped nanoparticles 201 substantially experience positive dielectrophoresis and move towards the part of the carrier fluid 101 where the electric field strength is highest. The p-doped nanoparticles 202 substantially experience negative dielectrophoresis and move towards the part of the carrier fluid 101 where the electric field strength is lowest.

When the positions of the nanoparticles 201,202 within the carrier fluid 101 are satisfactory, a curing process is implemented as previously described so as to vaporise the carrier fluid 101, remove the protective coating and sinter the nanoparticles 201,202. This is shown in FIG. 20, step C3.

Figure 17:
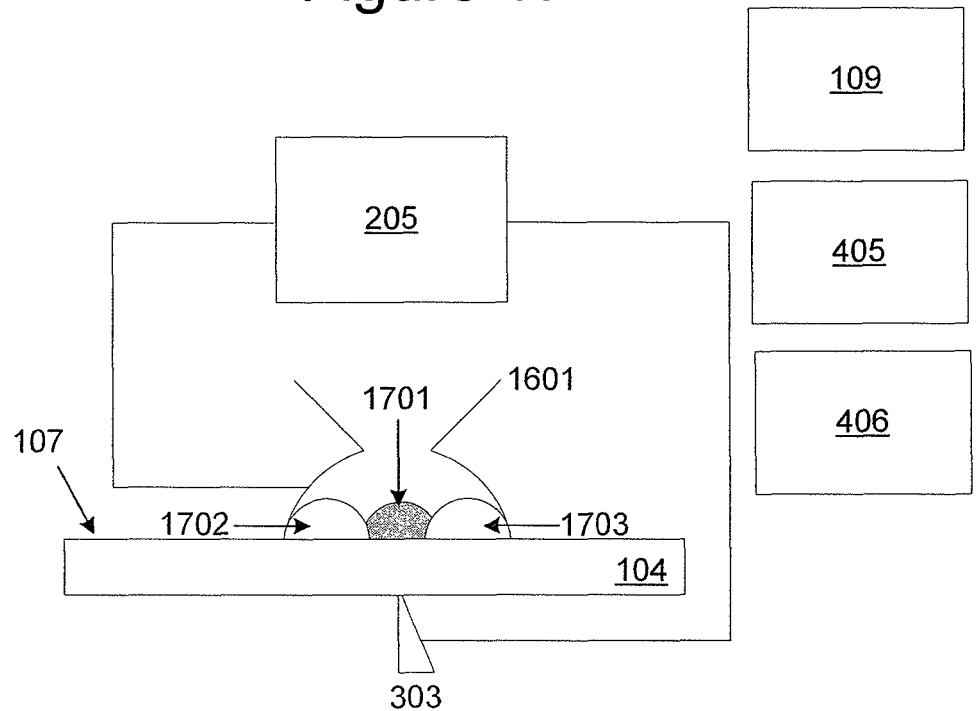
FIG. 17 is a side view of a semiconductor structure within a mould structure.
Figure 18A:
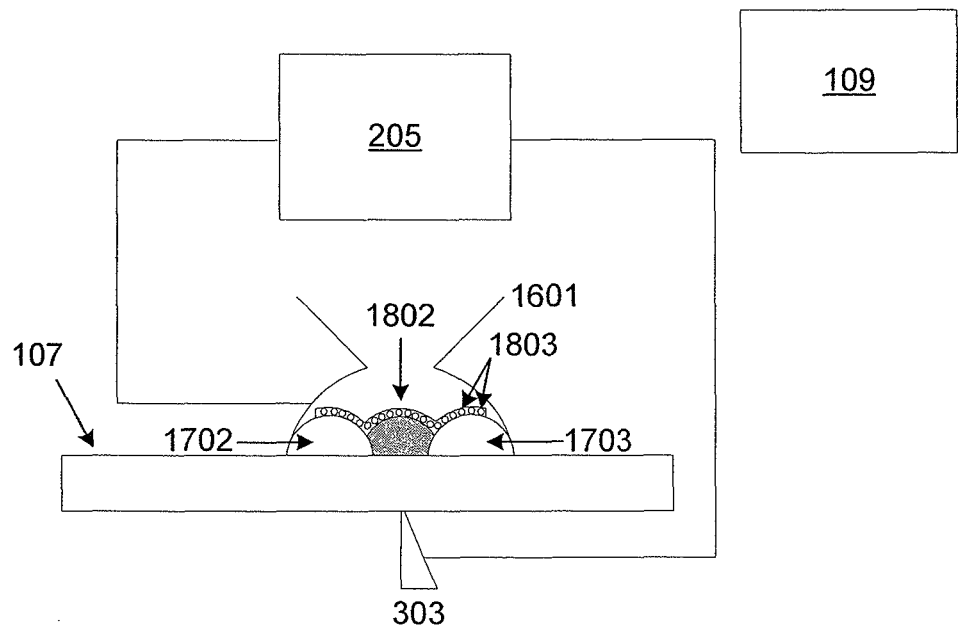
FIG. 18A is a side view of a semiconductor structure and a carrier fluid comprising nanoparticles of a dielectric material within a mould structure.
Figure 18B:
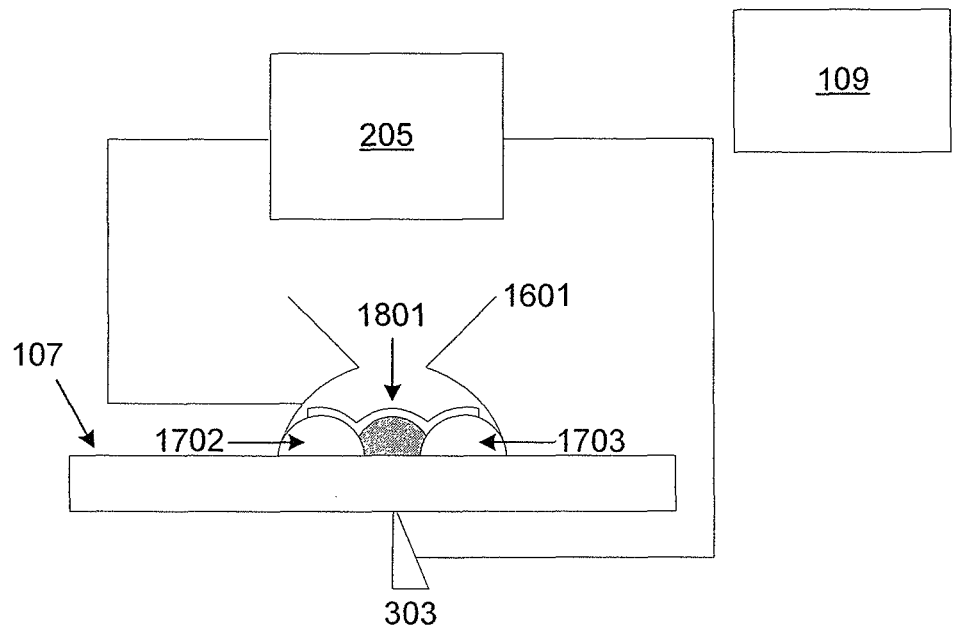
FIG. 18B is a side view of a semiconductor structure within a mould structure, the semiconductor structure having a dielectric region.
Figure 19:
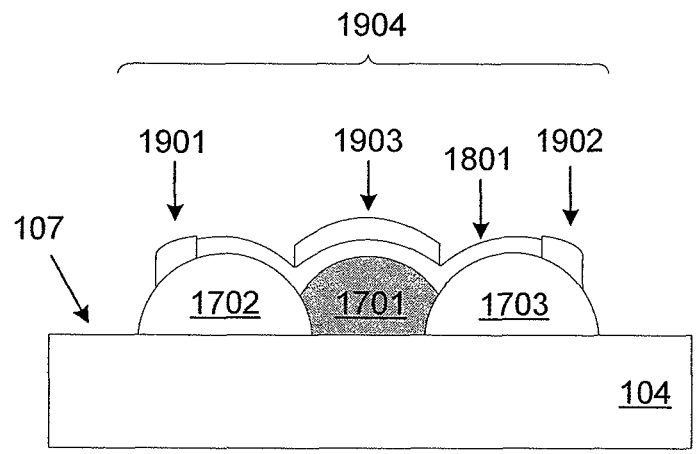
FIG. 19 is a side view of a semiconductor structure having a dielectric region and metal contacts.

Referring to FIG. 17, the result of the curing process is a semiconductor structure comprising a coherent p-type semiconducting material 1701 and two coherent n-type semiconducting materials 1702,1703. As described in the first and second examples above, a dielectric region 1801 is then formed on the surface of the n-type and p-type materials 1701,1702,1703 as shown by FIG. 18A, FIG. 18B and FIG. 20, step C4. The dielectric region 1801 is formed by the addition of a further carrier fluid 1802, comprising nanoparticles 1803 of a suitable dielectric material, such as silicon dioxide, to the surface of the n-type and p-type materials 1701,1702,1703 using a delivery mechanism 103 such as the inkjet printer previously discussed. The positions of the nanoparticles 1803 may be manipulated within the further carrier fluid 1802 by dielectrophoresis and a curing process may be employed to make the dielectric region 1801 permanent. The dielectric region 1801 may alternatively comprise any other suitable insulating material and may be formed by any suitable technique.

Once the curing process for the dielectric region 1801 has been completed, the mould structure 1601 is removed from the surface 107 of the dielectric material 104 in step C5. In step C6, metal contacts 1901,1902,1903 are formed on the surfaces of the n-regions 1702,1703 and dielectric region 1801, by means as described in relation to the first and second examples above, so as to create source, drain and gate contacts for a NMOS transistor 1904.

The skilled person will appreciate that the above-described alternative implementation could also be used where the carrier fluid 101 contains only n-doped nanoparticles 201, or only p-doped nanoparticles 202 as discussed in the second example of the invention. The skilled person will also appreciate that any of the semiconductor structures described in the first or second example of the invention could be formed using the above-described alternative implementation.

All of the above-described embodiments and alternatives may be used either singly or in combination to achieve the effects provided by the invention.

It should be realised that the foregoing examples should not be construed as limiting. Other variations and modifications will be apparent to persons skilled in the art upon reading the present application. Such variations and modifications extend to features already known in the field, which are suitable for replacing the features described herein, and all functionally equivalent features thereof. Moreover, the disclosure of the present application should be understood to include any novel features or any novel combination of features either explicitly or implicitly disclosed herein or any generalisation thereof and during the prosecution of the present application or of any application derived therefrom, new claims may be formulated to cover any such features and/or combination of such features.

The invention claimed is:

1. An apparatus comprising:
  a carrier fluid delivery mechanism;
  an electric field source;
  an energy source; and
  a protective coating application mechanism that applies a protective coating to a plurality of nanoparticles;
  wherein the carrier fluid delivery mechanism applies a carrier fluid carrying the plurality of nanoparticles to a substrate, the electric field source manipulates the positions of the nanoparticles on the substrate by dielectrophoresis, and the energy source removes the carrier fluid from the substrate and the protective coating from the nanoparticles, so as to leave the nanoparticles on the substrate, and sinter the nanoparticles; and
  wherein the carrier fluid delivery mechanism comprises an inkjet printer.

2. The apparatus of claim 1, wherein the energy source emits electromagnetic radiation in the infra-red band.

3. The apparatus of claim 1, further comprising:
  a mold structure, wherein the mold structure is configured to contain the carrier fluid on the substrate.

4. The apparatus of claim 1, further comprising:
  a temperature control mechanism, wherein the temperature control mechanism is connected to control the temperature of the substrate.

5. The apparatus of claim 1, wherein the protective coating comprises a monomer or polymer coating.

6. The apparatus of claim 1, wherein the nanoparticles comprise semiconductor nanoparticles.

7. The apparatus of claim 6, wherein the nanoparticles comprise n-doped nanoparticles and p-doped nanoparticles and the sintered nanoparticles form a semiconducting n-region and a semiconducting p-region.

8. The apparatus of claim 6, further comprising:
  a dielectric region on a surface of the sintered nanoparticles; and
  a metal contact on a surface of the dielectric region.

* * * * *